(12) United States Patent
Redwine et al.

(10) Patent No.: US 6,990,035 B2
(45) Date of Patent: Jan. 24, 2006

(54) CIRCUIT AND METHOD FOR REDUCING SRAM STANDBY POWER

(75) Inventors: Donald J. Redwine, Canton, TX (US); Robert R. Doering, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 124 days.

(21) Appl. No.: 10/727,888

(22) Filed: Dec. 3, 2003

(65) Prior Publication Data

US 2005/0122821 A1 Jun. 9, 2005

(51) Int. Cl.
*G11C 7/00* (2006.01)

(52) U.S. Cl. .................................. 365/227; 365/233
(58) Field of Classification Search ................ 365/227, 365/226, 230.06
See application file for complete search history.

(56) References Cited

U.S. PATENT DOCUMENTS

| | | | | |
|---|---|---|---|---|
| 5,873,112 A | * | 2/1999 | Norman | 365/185.18 |
| 5,896,318 A | * | 4/1999 | Asada et al. | 365/230.03 |
| 6,151,262 A | | 11/2000 | Haroun et al. | |
| 6,549,453 B2 | * | 4/2003 | Wong | 365/156 |

* cited by examiner

*Primary Examiner*—Thong Q. Le
(74) *Attorney, Agent, or Firm*—Rose Alyssa Keagy; W. James Brady, III; Frederick J. Telecky, Jr.

(57) ABSTRACT

A method of operating a memory circuit to reduce standby current is disclosed. The method includes applying a first voltage (Vdd) to a power terminal (224) of a memory cell having a first (612) and a second (614) data terminal. A data bit is stored in a memory cell (600,602,604,606). A second voltage (VDA) different from the first voltage is applied to the power terminal. A third voltage (Ground) is applied to the first and second data terminals. The first voltage is applied to the power terminal.

27 Claims, 3 Drawing Sheets

CIRCUIT AND METHOD FOR REDUCING SRAM STANDBY POWER

FIELD OF THE INVENTION

This invention generally relates to electronic circuits, and more specifically to power reduction in semiconductor integrated circuits.

BACKGROUND OF THE INVENTION

The continuing popularity of portable electronic devices presents manufacturers with contrary goals. Battery capacity is dependent upon battery size and weight. Thus portable electronic devices could be made to operate a longer time between battery changes or recharging if these devices included heavier batteries with greater capacity. On the other hand, portable electronic devices would be more popular and more widely used if they were lighter. However, lighter weight translates into reduced battery capacity and reduced operating times. A large reduction in size of wireless telephones has taken place without significant reduction in operating times. While improvements in batteries have increased their capacity per unit weight, most of the improvement in operating time and reduction in device weight has come from improvements in the power consumption of the electronics. Many improvements have taken place in integrated circuit manufacture that have reduced the amount of power consumed by the electronics. Additional improvements have taken place by selective powering of portions of the electronics. To a large degree much of the advantage of selectively powering a microcontroller unit or a digital signal processor have already been realized by current state of the art devices. Thus manufacturers seek additional areas for power consumption reduction.

This additional area may be the system memory. Many portable electronic devices include substantial amounts of memory. Power savings may be gained by selectively powering either nonvolatile or volatile memory in respective active and standby operating modes. A circuit and method for optimally switching between active and standby operating modes is described by Haroun et al. in U.S. Pat. No. 6,151,262, which is incorporated herein by reference. Many circuit functions of volatile memory circuits such as dynamic random access memory (DRAM) and static random access memory (SRAM) may be suspended without loss of stored data. Moreover, some volatile memory in a wireless memory circuit may be used for computational storage, voice recognition, or other applications where data storage is only temporary. The process of fully powering these memory circuits typically requires much more time than that required for a memory access in the fully powered state. Thus, memory access time from a low power or standby state includes both the time required to power up the memory circuit and the normal access time. However, access times of these memories remains important, so it may not be feasible to completely shut the memory down to conserve power.

The inventors of the present invention have recently discovered that static random access memory cells power up in a state that minimizes leakage current. This phenomenon is explained with reference to TABLE I and FIGS. 4 and 5.

TABLE I

| Normalized Cell Area | IDQ0 Mean | IDQ1 Mean | Power Up Mean | IDQ Ratio |
|---|---|---|---|---|
| 0.84 | 3.65E-5 | 3.66E-5 | 4.30E-9 | 8500 |
| 0.89 | 6.33E-5 | 6.32E-5 | 6.00E-9 | 10542 |
| 0.92 | 6.02E-5 | 6.02E-5 | 4.10E-9 | 14683 |
| 0.92 | 9.00E-7 | 9.06E-7 | 3.90E-9 | 232 |
| 0.95 | 9.03E-7 | 8.10E-7 | 3.90E-9 | 220 |
| 1.00 | 5.80E-9 | 3.60E-9 | 2.90E-9 | 1.6 |

Referring to TABLE I, there are six rows representing different 6-T memory cells. These memory cells were fabricated by a complementary metal oxide semiconductor (CMOS) process. Mean entries in TABLE I are an average of measured data from fifty similar memory cells. The memory cells are arranged in order of normalized cell area as indicated in the left column. The top row, therefore, corresponds to the smallest cell area. The second column from the left is the measured quiescent current when the memory cells store a true zero data state (IDQ0). The third column from the left is the measured quiescent current when the memory cells store a true one data state (IDQ1). The fourth column from the left is the quiescent current for the memory cells of each row immediately after power up and before any data is written to the memory cells. The far right column is a ratio of the average of quiescent currents IDQ0 and IDQ1 divided by the quiescent current immediately after power up. The table shows that all except the last two rows have approximately the same quiescent current for either a true one or a true data state. The difference between IDQ0 and IDQ1 for the last two rows is slightly greater than for the previous four rows. For example, IDQ0 for the last row is 5.80E-9 A and IDQ1 is 3.60E-9. Thus, the IDQ1 current is about 60% greater than the IDQ0 current. By way of comparison, however, each entry in the fourth column is significantly less than either of the corresponding IDQ0 or IDQ1 current. The quiescent current immediately after power up for each type of memory cells, therefore, is significantly less than either IDQ0 or IDQ1. For example, the second and third rows show more than four orders of magnitude less current in their respective power up states than the mean of either IDQ0 or IDQ1. The fourth and fifth rows show more than two orders of magnitude less current in their respective power up states than the mean of either IDQ0 or IDQ1. Thus, the ratio in the far right column of average quiescent current (IDQ) to power up current in the fourth column decreases significantly with increasing cell area as indicated in the first column.

FIG. 4 illustrates a six-transistor (6-T) static random access memory cell. The memory cell includes P-channel transistors 400 and 402 and N-channel transistors 404 and 406 connected as a latch. N-channel pass gate transistors 408 and 410 couple bitline BL and complementary bitline/BL to respective data terminals of the memory cell. The heavy dotted line of N-channel transistor 406 indicates it has greater subthreshold leakage than N-channel transistor 404. This greater leakage may be due to many different factors including inconsistent polycrystalline silicon gate length, nonsymmetrical channel implants, nonsymmetrical source/drain implants, or other factors. In fact, the leakage of N-channel transistor 406 may be as much as two orders of magnitude or one hundred times greater than N-channel transistor 404. For example, a typical transistor such as N-channel transistor 404 may have a subthreshold leakage current of 1 nA. By way of comparison, a leaky transistor such as N-channel transistor 406 may have a subthreshold current of 10 nA. If residual data in a 256 K static random access memory with a 1.2 V power supply voltage leaves half of the data bits in a high leakage state, therefore, the memory array alone will dissipate 1.4 mW more power than if the entire array were in a low leakage state.

During power up when the wordline WL is off, power supply voltage Vdd is applied to the sources of P-channel transistors 400 and 402. Current flows through the P-channel transistors to common drain terminals 412 and 414, respectively. Since N-channel transistor 406 has a greater leakage current than N-channel transistor 404, however, terminal 414 has a lower voltage than terminal 412. As power supply voltage Vdd increases, the voltage at terminal 412 exceeds the threshold voltage of N-channel transistor 406 while the voltage at terminal 414 is still below the threshold voltage of N-channel transistor 404. Thus, N-channel transistor 406 becomes increasingly conductive and pulls terminal 414 even lower. This lower voltage at terminal 414 turns on P-channel transistor 400 and keeps N-channel transistor 404 off. This drives terminal 412 even higher, turning off P-channel transistor 402 and turning on N-channel transistor 406 even more. This regenerative effect continues as power supply voltage Vdd increases. When power supply voltage Vdd reaches a final value, therefore, terminal 414 is held at zero volts or ground and terminal 412 is held at power supply voltage Vdd. In this state, transistors 400 and 406 are both on. The leakage of the memory cell, therefore, is controlled by transistors 402 and 404, both of which are less leaky than transistor 406.

Referring now to FIG. 5, there is another 6-T static random access memory cell. This memory cell is similar to the memory cell of FIG. 4 except that the P-channel transistor 500 has a greater leakage current than P-channel transistor 502 as indicated by the heavy dotted line. N-channel transistors 504 and 506 have approximately the same leakage current. When power supply voltage Vdd is applied during power up, therefore, P-channel transistor 500 produces a relatively higher voltage at terminal 512 than the voltage at terminal 514. As power supply voltage Vdd increases, this relatively higher voltage turns on N-channel transistor 506 while N-channel transistor 504 is still off. N-channel transistor 506, therefore, pulls terminal 514 even lower, thereby turning on P-channel transistor 500 and holding N-channel transistor 504 off. The increasingly conductive P-channel transistor 500 drives terminal 512 higher, thereby turning off P-channel transistor 502 and turning on N-channel transistor 506 even more. When power supply voltage Vdd reaches a final value, therefore, terminal 514 is held at zero volts or ground and terminal 512 is held at power supply voltage Vdd. In this state, transistors 500 and 506 are both on. The leakage of the memory cell, therefore, is controlled by transistors 502 and 504, both of which are less leaky than transistor 500.

Memory cells of the prior art did not comprehend this pattern sensitive difference in quiescent current. Quiescent power dissipation of these prior art memory cell arrays was determined by the existing data state of each memory cell during standby operation. Random data states of the memory cells might result in power dissipation similar to all-zero or all-one data states. This quiescent power dissipation, however, might be much greater than an all-zero or all-one data pattern. The worst case quiescent power dissipation of prior art memory arrays corresponds to a data state opposite the power up data state. This worst power dissipation may be an order of magnitude greater than either the all-zero or all-one quiescent power dissipation.

The present invention describes a circuit and method to advantageously incorporate this power saving phenomenon in a portable electronic device such as a telephone handset, a handheld computer, a portable video game, or other battery powered device to greatly reduce standby current. The reduced standby current in the static random access memory array prolongs battery life and operating time, resulting in less frequent battery recharging.

SUMMARY OF THE INVENTION

In accordance with a preferred embodiment of the invention, there is disclosed a method of operating a memory circuit. The method includes applying a first voltage to a power terminal of a memory cell having a first and a second data terminal. A data bit is stored in the memory cell. A second voltage different from the first voltage is applied to the power terminal. A third voltage is applied to the first and second data terminals. The first voltage is applied to the power terminal. The memory cell powers up in a state providing minimum leakage. Standby power is greatly reduced.

BRIEF DESCRIPTION OF THE DRAWINGS

The foregoing features of the present invention may be more fully understood from the following detailed description, read in conjunction with the accompanying drawings, wherein.

DETAILED DESCRIPTION OF PREFERRED EMBODIMENTS

Figure 1:
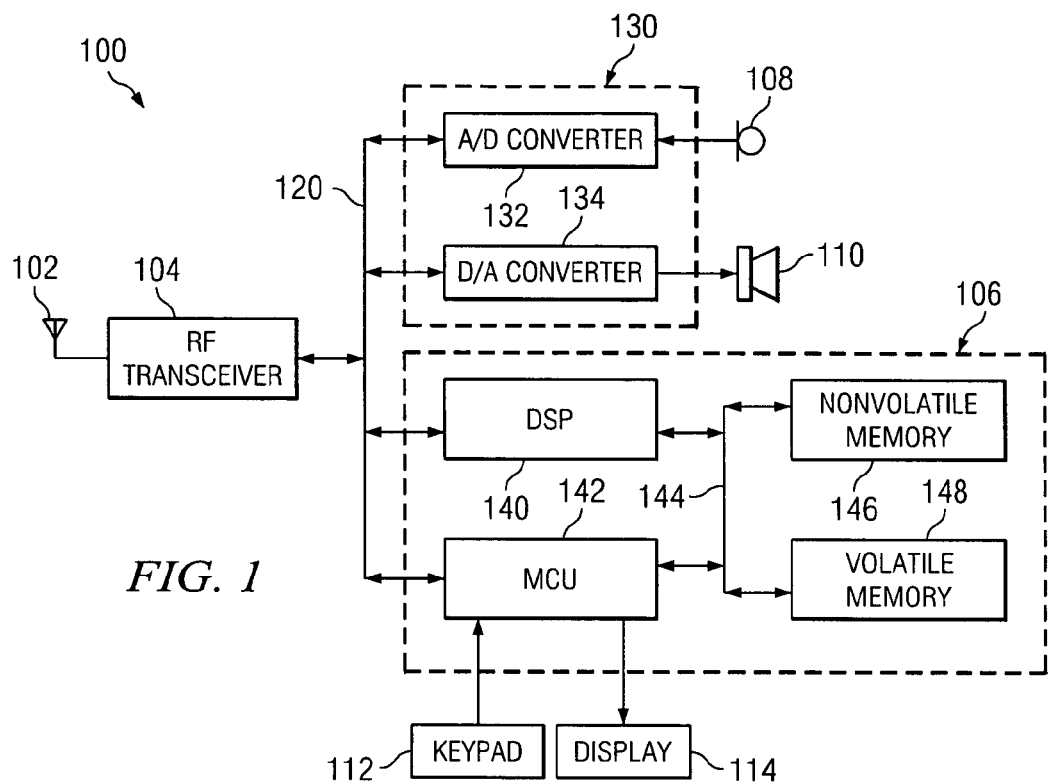
FIG. 1 is a block diagram of a wireless telephone which is an example of a portable electronic device which may advantageously employ the present invention.

Referring to FIG. 1, there is a block diagram of a wireless telephone as an example of a portable electronic device which could advantageously employ this invention. Wireless telephone 100 includes antenna 102, radio frequency transceiver 104, baseband circuits 106, microphone 108, speaker 110, keypad 112, and display 114. The wireless telephone is preferably powered by a rechargeable battery (not shown) as is well known in the art. Antenna 102 permits wireless telephone 100 to interact with the radio frequency environment for wireless telephony in a manner known in the art. Radio frequency transceiver 104 both transmits and receives radio frequency signals via antenna 102. The transmitted signals are modulated by the voice/data output signals received from baseband circuits 106 on bus 120. The received signals are demodulated and supplied to baseband circuits 106 as voice/data input signals on bus 120. An analog section 130 includes an analog to digital converter 132 connected to microphone 108 to receive analog voice signals. The analog to digital converter 132 converts these analog voice signals to digital data and applies them to digital signal processor 140 via bus 120. Analog section 130 also includes a digital to analog converter 134 connected to speaker 110. Speaker 110 provides the voice output to the user. Digital section 106 is embodied in one or more integrated circuits and includes a microcontroller unit 142, a digital signal processor 140, nonvolatile memory circuit 146, and volatile memory circuit 148. Nonvolatile memory circuit 146 may include read only memory (ROM), ferroelectric memory (FeRAM), FLASH memory, or other nonvolatile memory as known in the art. Volatile memory circuit 148 may include dynamic random access memory (DRAM), static random access memory (SRAM), or other volatile memory circuits as known in the art. Microcontroller unit 142 interacts with keypad 112 to receive telephone number inputs and control inputs from the user. Microcontroller unit 142 supplies the drive function to display 114 to display numbers dialed, the current state of the telephone such as battery life remaining, and received alphanumeric messages. Digital signal processor 140 provides real time signal processing for transmit encoding, receive decoding, error detection and correction, echo cancellation, voice band filtering, etc. Both microcontroller unit 142 and digital signal processor 140 interface with nonvolatile memory circuit 146 via bus 144 for program instructions and user profile data. Microcontroller unit 142 and digital signal processor 140 also interface with volatile memory circuit 148 via bus 144 for signal processing, voice recognition processing, and other applications.

Figure 2:
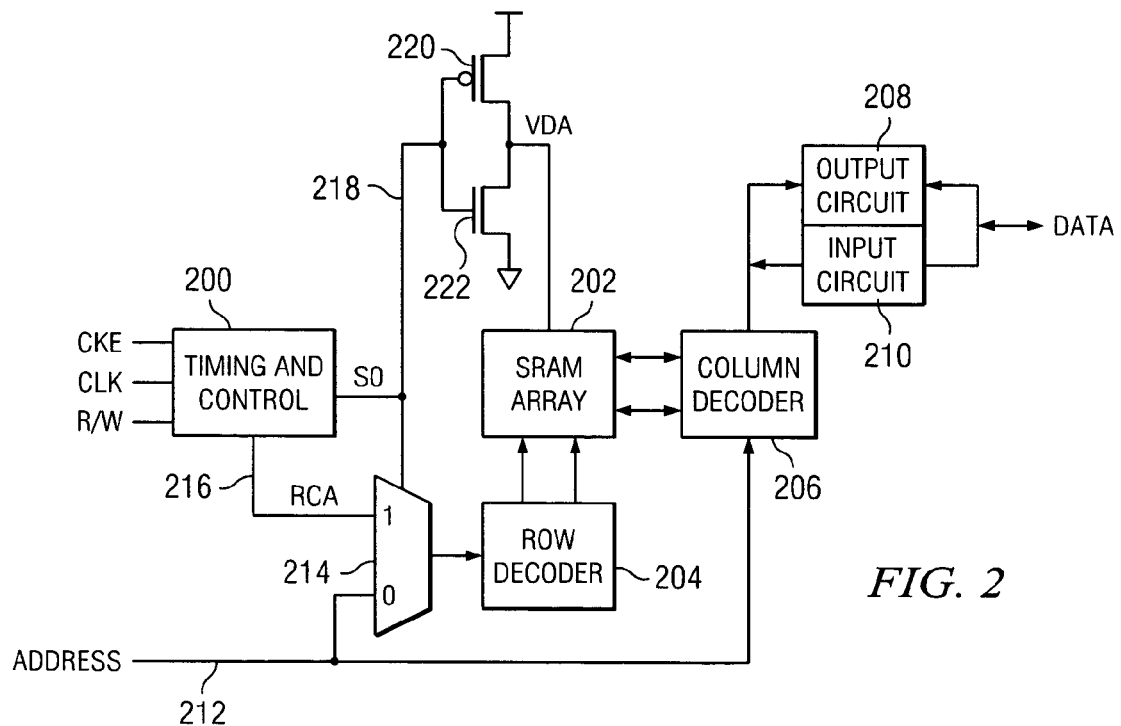
FIG. 2 is a block diagram of a static random access memory as may be used in the volatile memory circuit 148 of FIG. 1.

Referring to FIG. 2, there is a block diagram of a static random access memory as may be used in the volatile memory circuit 148 of FIG. 1. The static random access memory includes a timing and control circuit 200 coupled to receive a clock enable signal CKE, a system clock signal CLK, and a read/write signal R/W. The timing and control signal generates internal control signals (not shown) to control read and write operations of the static random access memory. The timing and control circuit also generates a control signal S0 on lead 218 and a row counter address RCA on bus 216 as will be explained in detail. Control signal S0 is applied to the control terminals of P-channel transistor 220 and N-channel transistor 222. The common drain terminal of P-channel transistor 220 and N-channel transistor 222 produces array power supply voltage VDA at lead 224. An address applied to bus 212 includes row and column address bits. The row address bits are applied to multiplex circuit 214. The column address bits are applied to column decoder circuit 206. Multiplex circuit 214 selectively applies one of the external row address bits on bus 212 or the row counter address RCA on bus 216 to row decoder circuit 204 in response to the logic state of control signal S0. A high logic state of control signal S0 will apply row counter address RCA to the row decoder circuit 204. Alternatively, a low logic state of control signal S0 will apply the row address on bus 212 to the row decoder circuit 204. The row decoder circuit activates a wordline in response to the row address from multiplex circuit 214, thereby selecting a row of memory cells from the static random access memory array 202. The column decoder circuit 206 selects a column of memory cells in response to the column address bits on bus 212. A data bit at the intersection of the selected row and column produces data to output circuit 208 during a read operation. Alternatively, the data bit at the intersection of the selected row and column receives data from input circuit 210 during a write operation.

Figure 3:
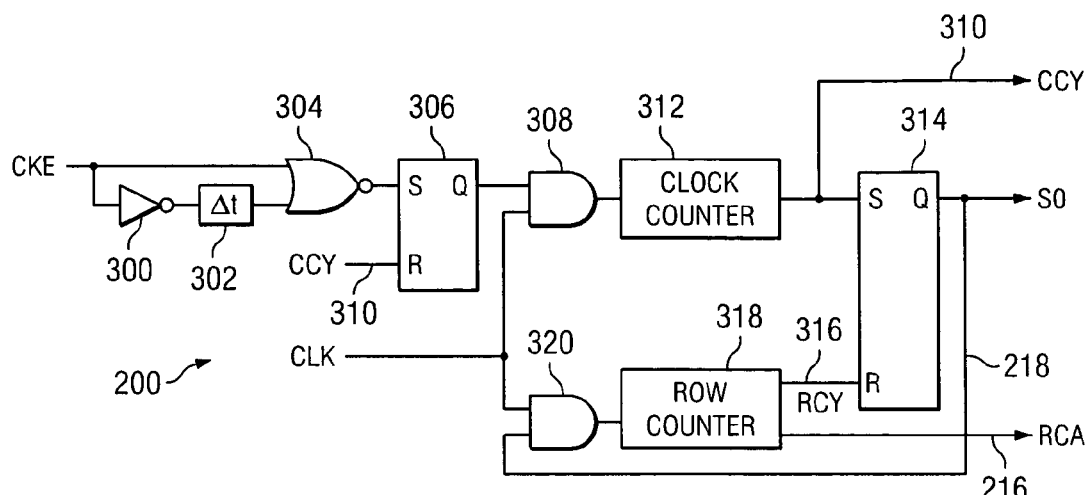
FIG. 3 is a circuit diagram of a portion of the timing and control circuit 200 of FIG. 2.
Figure 4:
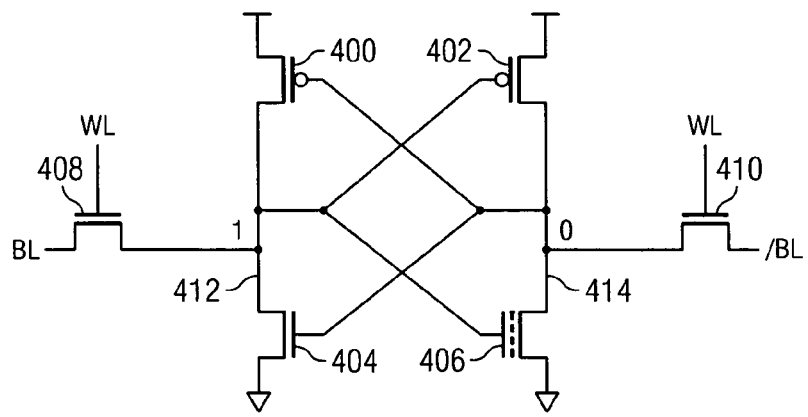
FIG. 4 is a schematic diagram of a 6-T memory cell of the static random access memory array 202 of FIG. 2.
Figure 5:
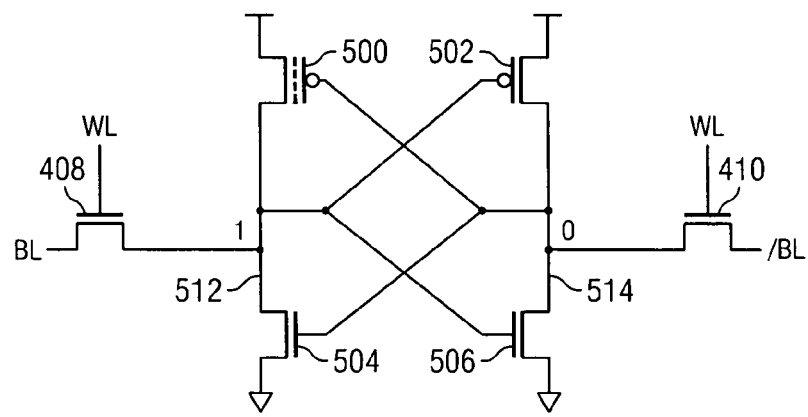
FIG. 5 is a schematic diagram of another 6-T memory cell of the static random access memory array 202 of FIG. 2.

Turning now to FIG. 3, there is a schematic diagram of a portion of timing and control circuit 200 of FIG. 2. The timing and control circuit includes an edge detector circuit formed by inverter 300, delay circuit 302, and NOR gate 304. The output of NOR gate 304 is coupled to the S input of S-R flip flop 306. The R input of S-R flip flop 306 is coupled to receive clock counter carry signal CCY on lead 310. The Q output of S-R flip flop is applied to AND gate 308 together with clock signal CLK. The output of AND gate 308 is applied to clock counter circuit 312. Clock counter carry signal CCY on lead 310 is applied to the S input of S-R flip flop 314. The Q output of S-R flip flop 314 produces control signal S0 on lead 218, which is applied to AND gate 320 together with clock signal CLK. The output of AND gate 320 is coupled to row counter circuit 318. Row counter circuit 318 produces row counter address signal RCA on bus 216 and row counter carry signal RCY on lead 316.

In normal operation, the timing and control circuit 200 receives a high level clock enable signal CKE. This high level produces a low level output from NOR gate 304 at the S input of S-R flip flop 306. The Q output of S-R flip flop 306, therefore, remains low as will be described in detail. The low level of the Q output S-R flip flop 306 produces a low level output from AND gate 308 so that clock counter circuit 312 does not receive clock signal CLK or generate clock counter carry signal CCY. Thus, control signal S0 at the Q output of S-R flip flop 314 remains low. This low level of control signal S0 applied to an input of AND gate 320 produces a low level output so that row counter circuit 318 does not receive clock signal CLK. Thus, row counter carry signal RCY remains low and row counter circuit 318 does not produce row counter address signal RCA.

The static random access memory circuit enters a standby operating mode when clock enable signal CKE goes low. This high-to-low transition produces a high level pulse output from NOR gate 304. The low level of clock enable signal CKE is inverted by inverter 300 and delayed for a time Δt determined by delay circuit 302. After this delay, a high level signal from delay circuit 302 produces a low output from NOR gate 304. The high level pulse from NOR gate 304 sets a high level Q output from S-R flip flop 306. This high level Q output is applied to AND gate 308, thereby passing clock signal CLK to clock counter circuit 312. Clock counter circuit 312 includes a predetermined number of stages which count cycles of clock signal CLK until a grace period has elapsed. Overflow of clock counter circuit 312 at the end of the grace period produces a clock counter carry signal CCY on lead 310. The high level of counter carry signal CCY sets control signal S0 at the Q output of S-R flip flop 314 high. After one more cycle of clock signal CLK, the high level of counter carry signal CCY also resets S-R flip flop 306. This additional cycle of clock signal CLK applied to clock counter circuit 312 resets counter carry signal CCY to a low level.

The high level of control signal S0 on lead 218 is applied to multiplex circuit 214 (FIG. 2) to select row counter address signal RCA on bus 216 as previously described. Control signal S0 is also applied to AND gate 320, thereby passing clock signal CLK to row counter circuit 318. In response to clock signal CLK, row counter circuit 318 produces a sequence of row address signals on bus 216. These row address signals are subsequently applied to row decoder circuit 204 (FIG. 2) to sequentially activate each wordline in the static random access memory array 202. When row counter circuit 318 has completed the sequence of row addresses, the counter overflows and produces row counter carry signal RCY on lead 316. Row counter carry signal RCY resets control signal S0 at the Q output of S-R flip flop 314 low, thereby resetting multiplex circuit 214 to pass row address bits from bus 212 on a subsequent memory access. The low level of control signal S0 applied to AND gate 320 also ceases application of clock signal CLK to row counter circuit 318.

Figure 6:
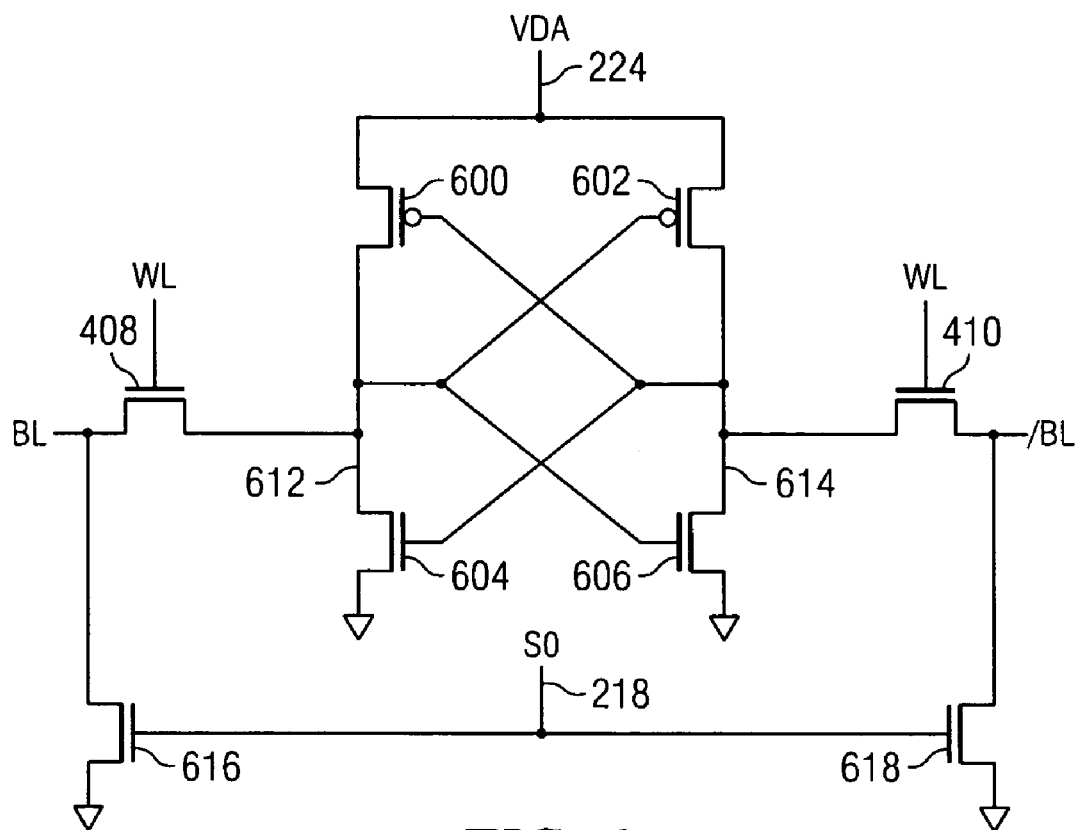
FIG. 6 is a schematic diagram of a memory cell of the static random access memory array of FIG. 2 with precharge transistors of the present invention.

Turning now to FIG. 6, there is a static random access memory cell of the present invention. The memory cell includes P-channel transistors 600 and 602 and N-channel transistors 604 and 606. The sources of P-channel transistors 600 and 602 are coupled to receive array power supply voltage VDA on lead 224. N-channel pass gate transistors 408 and 410 couple memory cell data terminals 612 and 614 to bitline BL and complementary bitline/BL terminals, respectively. The bitline BL and complementary bitline/BL terminals are coupled to a respective column of memory cells by respective N-channel pass gate transistors. Other memory cells in the column are not shown to preserve clarity in the following explanation. Each column of memory cells includes a respective pair of N-channel precharge transistors 616 and 618 coupled between bitline BL and complementary bitline/BL and ground, respectively. The control terminals of N-channel precharge transistors 616 and 618 are coupled to receive control signal S0 on lead 218.

Figure 7:
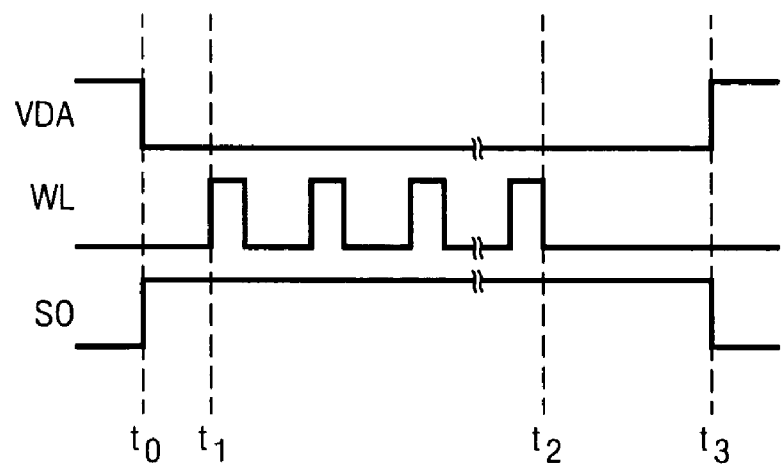
FIG. 7 is a timing diagram of the memory cell of FIG. 6 illustrating operation of an embodiment of the present invention.

Referring now to FIG. 7, operation of the memory cell of FIG. 6 will be explained in detail. During active operation prior to time t0, array power supply voltage VDA is high and control signal S0 is low. In this active mode, the static random access operates in a manner similar to memories of the prior art. When clock enable signal CKE (FIGS. 2 and 3) goes low, however, the static random access memory enters a standby mode of operation. This high-to-low transition of clock enable signal CKE initiates a grace period as previously explained. The duration of this grace period is preferably determined by clock counter circuit 312 (FIG. 3). After expiration of the grace period, control signal S0 goes high at time $t_0$. The high level of control signal S0 turns off P-channel transistor 220 and turns on N-channel transistor 222 (FIG. 2), thereby driving array power supply voltage VDA to zero volts or ground. Other peripheral circuits such as row 204 and column 206 decoder circuits continue to receive power from power supply voltage Vdd. Control signal S0 also selectively applies row counter address RCA on bus 216 to row decoder circuit 204. Finally, control signal S0 turns on N-channel precharge transistors 616 and 618 and corresponding N-channel transistors for each column of the static random access memory. Row counter circuit 318 (FIG. 3) then produces a sequence of row addresses beginning at time $t_1$. The active wordline at time $t_1$ turns on N-channel pass gate transistors 408 and 410, thereby coupling data terminals 612 and 614 to bitline BL and complementary bitline/BL, respectively. Bitline BL and complementary bitline/BL are coupled to ground through N-channel precharge transistors 616 and 618, respectively, in response to the high logic state of control signal S0. Thus, the data terminals 612 and 614 of the memory cell are coupled to ground. This advantageously precharges both data terminals of the memory cell and each memory cell connected to the active wordline WL to ground. This equalized precharge state eliminates any residual charge imbalance at the data terminals 612 and 614 of the memory cell. Row counter circuit 318 (FIG. 3) continues to address each wordline in the array until time $t_2$, when the row counter circuit generates row counter carry signal RCY. Row counter carry signal RCY then resets S-R flip flop 314 and produces a low level control signal S0 at time $t_3$. The low level of control signal S0 also turns off N-channel precharge transistors 616 and 618 (FIG. 6) and corresponding N-channel transistors for each column of memory cells. The low level of control signal S0 turns off N-channel transistor 222 and turns on P-channel transistor 220 (FIG. 2), thereby restoring array power supply voltage VDA to a high level. As array power supply voltage VDA increases, each memory cell of the static random access memory array powers up in a respective lowest leakage state as previously explained. This low leakage state forms a unique bit pattern within each static random access memory array. The low leakage of this unique state advantageously reduces standby power of the static random access memory. Moreover, for an exemplary 256 K static random access memory, an average power of approximately 25 $\mu$W for less than 3 $\mu$S is required to reset the static random access memory array to a low leakage state. This power consumption is negligible by comparison to the previously discussed 8 mW of power dissipation for half of the memory array bits in a high leakage state.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, N-channel transistors might precharge data terminals to a different reference voltage than ground. This may be accomplished by an existing bitline precharge circuit of the memory array. In another embodiment of the present invention, the bitline precharge circuit may precharge the bitlines to one reference voltage for normal circuit operation and to a different reference voltage prior to power up. Alternatively, a single N-channel transistor might be used to simply equalize the voltage of bitline BL and complementary bitline/BL. Furthermore, the unique bit pattern might be stored in a separate nonvolatile memory and rewritten to the static random access memory after expiration of the grace period.

In view of the foregoing discussion, it is intended that the appended claims encompass any such modifications or embodiments.

What is claimed is:

1. A method of operating a memory circuit, comprising the steps of:
    applying a first voltage to a power terminal of a memory cell having a first and a second data terminal;
    storing a data bit in the memory cell while the power terminal receives the first voltage;
    applying a second voltage different from the first voltage to the power terminal;
    applying a third voltage to the first and second data terminals while the power terminal receives the second voltage; and
    applying the first voltage to the power terminal.

2. The method as in claim 1, comprising the step of removing the third voltage from the first and second data terminals.

3. The method as in claim 1, wherein the step of applying the third voltage comprises activating a wordline.

4. The method as in claim 3, wherein the step of applying the third voltage comprises activating a control signal.

5. The method as in claim 1, comprising the steps of:
    detecting a control signal at the memory circuit;
    waiting for a grace period after the step of detecting; and applying the second voltage and the third voltage in response to the step of waiting.

6. The method as in claim 5, wherein the grace period is determined by counting a predetermined number of clock cycles.

7. The method as in claim 1, comprising the steps of:
detecting a control signal at the memory circuit; and
applying the second voltage and the third voltage in response to the step of detecting.

8. A memory circuit, comprising:
an array of memory cells arranged in rows and columns, each memory cell having a power terminal, a control terminal, a first data terminal, and a second data terminal;
a plurality of bitline pairs, each bitline pair coupled to respective first and second data terminals of each memory cell in a respective column of memory cells.
a plurality of wordlines, each wordline coupled to a control terminal of a respective row of memory cells;
a row counter circuit coupled to receive a clock signal, the row counter circuit producing a sequence of row address signals in synchronization with the clock signal and in response to a control signal; and
a row decoder circuit coupled to a plurality of wordlines and coupled to receive the sequence of row address signals.

9. The memory circuit as in claim 8, comprising a clock counter circuit coupled to receive the clock signal, the clock counter circuit producing the control signal after a grace period.

10. The memory circuit as in claim 9, wherein the grace period corresponds to a number of clock cycles.

11. The memory circuit as in claim 8, wherein a processor produces the control signal after a grace period.

12. The method of operating an electronic device, comprising the steps of:
applying a first voltage to a first part of the electronic device;
applying a second voltage to a second part of the electronic device;
changing the first voltage to a third voltage different from the first voltage while maintaining the second voltage;
applying a fourth voltage to the first part of the electronic device while maintaining the second voltage;
removing the fourth voltage from the first part of the electronic device; and
changing the third voltage to the first voltage while maintaining the second voltage.

13. The method as in claim 12, wherein the first voltage is equal to the second voltage.

14. The method as in claim 12, wherein the first voltage is a power supply voltage and the third voltage is ground.

15. The method as in claim 12, wherein the first part of the electronic device is a memory array and the second part of the electronic device is a peripheral circuit.

16. The method as in claim 12, comprising the steps of:
detecting a control signal at the electronic device;
waiting for a grace period after the step of detecting; and
changing the first voltage to the third voltage in response to the step of waiting.

17. The method as in claim 16, wherein the grace period is determined by counting a predetermined number of clock cycles.

18. The method as in claim 12, comprising the steps of:
detecting a control signal at the electronic device; and
changing the first voltage to the third voltage in response to the step of detecting.

19. The method as in claim 12, wherein the electronic device is a wireless telephone handset.

20. The method as in claim 12, wherein the electronic device is a computer.

21. The method as in claim 12, wherein the electronic device is a video game.

22. The method as in claim 12, wherein the first voltage is an array supply voltage and wherein the first part is a memory array.

23. The method as in claim 12, wherein the second voltage is a peripheral supply voltage and wherein the second part is a peripheral circuit.

24. The method as in claim 23, wherein the peripheral circuit is a row decoder circuit.

25. The method as in claim 12, wherein the third voltage is ground.

26. The method as in claim 12, wherein the fourth voltage is a precharge voltage.

27. The method as in claim 12, wherein the step of applying the fourth voltage comprises activating a wordline and wherein the step of removing the fourth voltage comprises inactivating the wordline.

* * * * *